(12) United States Patent
Quek et al.

(10) Patent No.: US 6,248,618 B1
(45) Date of Patent: Jun. 19, 2001

(54) METHOD OF FABRICATION OF DUAL GATE OXIDES FOR CMOS DEVICES

(75) Inventors: Shyue Fong Quek, Petaling Jaya (MY); Ting Cheong Ang, Singapore (SG); Puay Ing Ong, Jouor (MY); Sang Yee Loong, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/415,246

(22) Filed: Oct. 12, 1999

(51) Int. Cl.[7] .............................................. H01L 21/8238
(52) U.S. Cl. .................. 438/199; 438/279; 438/229; 438/231; 438/981
(58) Field of Search .................................... 438/199, 216, 438/229, 231, 263, 264, 275, 279, 286, 594, 761, 770, 771, 787, 981

(56) References Cited

U.S. PATENT DOCUMENTS

| | | | |
|---|---|---|---|
| 4,474,829 | 10/1984 | Peters | 427/53.1 |
| 5,698,472 | 12/1997 | Harris | 437/239 |
| 5,863,819 | 1/1999 | Gonzalez | 438/238 |
| 5,880,029 | 3/1999 | Eisenbeiser et al. | 438/694 |
| 6,025,234 * | 2/2000 | Chou | 438/279 |
| 6,033,943 * | 2/2000 | Gardner | 438/199 |

OTHER PUBLICATIONS

G.D. Wilk et al., "Electrical Characteristics of High–Quality Sub–25–Å Oxides Grown by Ultraviolet Ozone Exposure at Low Temperature", Electron Device Letters, Mar. 1999, pp. 132–134.

* cited by examiner

*Primary Examiner*—Chandra Chaudhari
*Assistant Examiner*—Jack Chen
(74) *Attorney, Agent, or Firm*—George O. Saile; Rosemary L. S. Pike; William J. Stoffel

(57) ABSTRACT

A method of forming thick and thin gate oxides comprising the following steps. A silicon semiconductor substrate having first and second active areas separated by shallow isolation trench regions is provided. Oxide growth is selectively formed over the first active area by UV oxidation to form a first gate oxide layer having a first predetermined thickness. The first and second active areas are then simultaneously oxidized whereby the first predetermined thickness of the first gate oxide layer is increased to a second predetermined thickness and a second gate oxide layer having a predetermined thickness is formed in the second active area. The second predetermined thickness of the first oxide layer in the first active area is greater than the predetermined thickness of the second oxide layer in the second active area.

22 Claims, 2 Drawing Sheets

METHOD OF FABRICATION OF DUAL GATE OXIDES FOR CMOS DEVICES

FIELD OF THE INVENTION

The present invention relates generally to methods of fabrication of semiconductor devices, and specifically to fabrication of dual gate oxides in semiconductor CMOS devices.

BACKGROUND OF THE INVENTION

Fabrication of dual gate oxides in semiconductor devices requires several steps when thin and thick gate oxides are desired. These steps add time and cost in the fabrication of the semiconductor devices.

The "Electrical Characteristics of High-Quality Sub-25-Å Oxides Grown by Ultraviolet Ozone Exposure at Low Temperature;" Electron Device Letters, March, 1999, pp 132–134, G. D. Wilk and B. Brar; Publisher Item Identifier S 0741-3106/9510270-2, discusses a $UVO_3$ (ultraviolet ozone) oxidation method for controllably and reproducibly growing self-limiting ultrathin oxides from ~10–25 Å thick with excellent electrical properties at temperatures from 25° C. to 600° C., respectively. The self-limiting thickness depending primarily on the substrate temperature and the oxides so grown have comparable electrical quality to thermal oxides with similar leakage current densities and breakdown fields.

U.S. Pat. No. 5,880,029 to Eisenbeiser et al. describes a method of passivating semiconductor devices by exposing the surface of the semiconductor devices to deep ultraviolet (DUV) radiation, in an atmosphere including $O_2$, forming a layer of oxide ($SiO_2$) on the surface of the semiconductor material and forming a layer of passivation material on the layer of oxide.

U.S. Pat. No. 5,698,472 to Harris describes a method and device for oxidation of a semiconductor surface layer of SiC to form an insulating surface layer of $SiO_2$. The $SiO_2$ layer is formed by heating the semiconductor layer, feeding $O_2$ to the semiconductor layer which diffuses therein and reacts with the SiC to form C-oxides that diffuse out of the semiconductor layer and to form $SiO_2$, and illuminating it with vacuum ultraviolet light during at least a phase of the oxidation to improve the quality of the $SiO_2$ layer.

U.S. Pat. No. 4,474,829 to Peters describes a process for forming a layer of a native oxide on a semiconductor substrate surface by exposing a chosen oxygen-containing precursor over the substrate to radiation to form only charge-free atomic oxygen that in turn is the primary oxidizing species to form the native $SiO_2$ layer over the substrate.

U.S. Pat. No. 5,863,819 to Gonzalez describes a method of fabricating a DRAM access transistor with a dual gate oxide technique. Beginning with a substrate on which a local oxidation of silicon process has been performed, the process comprises: stripping a pad oxide layer and growing a sacrificial oxide layer; masking the sacrificial oxide layer with a photoresist to protect the memory array area; stripping the unmasked sacrificial oxide; stripping the photoresist; and growing a gate oxide layer which is thinner than the sacrificial oxide layer. Thereafter, the memory device fabrication may be completed using any known prior art techniques.

SUMMARY OF THE INVENTION

Accordingly, it is an object of the present invention to provide an improved method of forming dual gate oxides on a semiconductor structure.

Another object of the present invention is to provide a method of forming thick and thin gate oxides on a semiconductor structure in the formation of dual gate CMOS devices.

Yet another object of the present invention is to provide a method of forming thick and thin gate oxides on a semiconductor structure in the formation of dual gate CMOS devices with a reduced number of steps.

A further object of the present invention is to provide a selective method of forming a gate oxide using a mask and where the gate oxide is grown by means of using electromagnetic (EM) waves to break the chemical bonds of the oxygen molecule to form oxygen radicals to react with silicon (Si) to form $SiO_2$.

Other objects will appear hereinafter.

It has now been discovered that the above and other objects of the present invention may be accomplished in the following manner. Specifically, a silicon semiconductor substrate having first and second active areas separated by shallow isolation trench regions is provided. Oxide growth is selectively formed over the first active area by UV oxidation to form a first gate oxide layer having a first predetermined thickness. The first and second active areas are then simultaneously oxidized whereby the first predetermined thickness of the first gate oxide layer is increased to a second predetermined thickness and a second gate oxide layer having a predetermined thickness is formed in the second active area. The second predetermined thickness of the first oxide layer in the first active area is greater than the predetermined thickness of the second oxide layer in the second active area.

BRIEF DESCRIPTION OF THE DRAWINGS

The features and advantages of the method of fabricating dual gate oxides according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
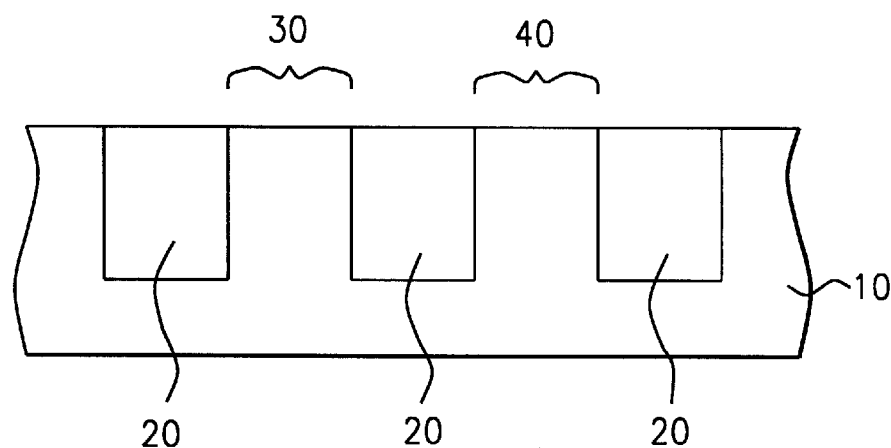
FIGS. 1–5 schematically illustrates in cross-sectional representation a preferred embodiment of the present invention.

Accordingly, as shown in FIG. 1 starting silicon semiconductor substrate 10 preferably includes a upper surface of silicon and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer. Unless otherwise specified, all structures, layers, etc. may be formed or accomplished by conventional methods known in the prior art.

Shallow trench isolation regions 20, preferably filled with $SiO_2$ and planarized, are formed by any conventional method and define a first active area 30 and a second active area 40.

Figure 2:
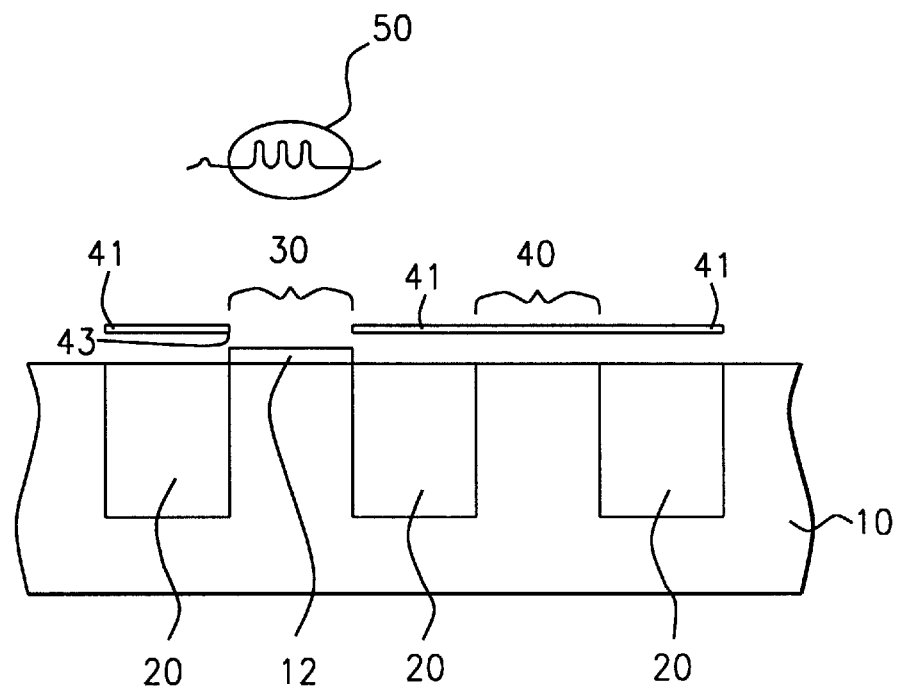

Referring to FIG. 2, well implants (not shown) may be implanted in first and second active areas 30, 40 followed by threshold voltage ($V_t$) implants (not shown) in first and second active areas 30, 40.

Any native oxide is removed, for example by an HF etch, and first gate silicon oxide (gate oxide) layer 12 is selectively grown over the surface of first active area 30 to a thickness from about 5 to 100 Å by an ultraviolet oxidation process as described below.

As compared to thermal oxidation of silicon where silicon (Si) reacts with molecular oxygen ($O_2$), i.e.

$$Si + O_2 \rightarrow SiO_2,$$

UV oxidation of silicon causes silicon to predominately react with oxygen radicals (O), i.e.

$$Si + 2O \rightarrow SiO_2.$$

The UV radiation causes the breakdown of either $O_3$ or $O_2$ into oxygen radicals based upon the wavelength used. As an example:

1. $O_2 + hv \rightarrow 2O$ for 184.9 nm line; and
2. $O_3 + hv \rightarrow O_2 + O$ for 253.7 nm line.

In the present invention, ultraviolet radiation, from UV lamp source 50 emits a wavelength line equal to or below 250 nm and a wavelength line greater than 250 nm, is used. For example, a 248 nm line (±10%) and a 365 nm line (±10%) may be used.

The UV oxidation process of the present invention permits formation of self-limiting first gate oxide layer 12. Mask 41 is used to selectively grow first gate oxide layer 12 only in first active area 30 by blocking out the UV light from the structure except for first active area 30. Therefore UV oxidation takes place only in first active area 30 where the UV light is not blocked, i.e. where the UV light passes through aperture 43 in mask 41.

A self-limiting gate oxide is a gate oxide with a well controlled thickness that is primarily related to the temperature at which the UV oxidation process is conducted, with a minimum of thermal oxidation at lower temperatures. In the present invention, one or both of the following reactions occur:

| 1. | a) | $2O_3 + hv > 250$ nm | -> | $2O_2 + 2O$ |
|---|---|---|---|---|
|    | b) | $Si + 2O$            | -> | $SiO_2$; or |
|    | c) | $Si + 2O_3 + hv > 250$ nm | -> | $SiO_2 + 2O_2$ | with an $O_3$ flow between about 1000 and 10,000 sccm; and

| 2. | a) | $O_2 + hv \leq 250$ nm | -> | $2O$ |
|---|---|---|---|---|
|    | b) | $Si + 2O$              | -> | $SiO_2$; or |
|    |    | $Si + O_2 + hv \leq 250$ nm | -> | $SiO_2$ | with an $O_2$ flow between about 1000 and 10,000 sccm. to form gate oxide layer 12 in first active area 30 at a temperature from about 25 to 800° C. for a period of from about one (1) second to 600 minutes and a pressure from about 1 mTorr to 760 Torr.

Figure 3:
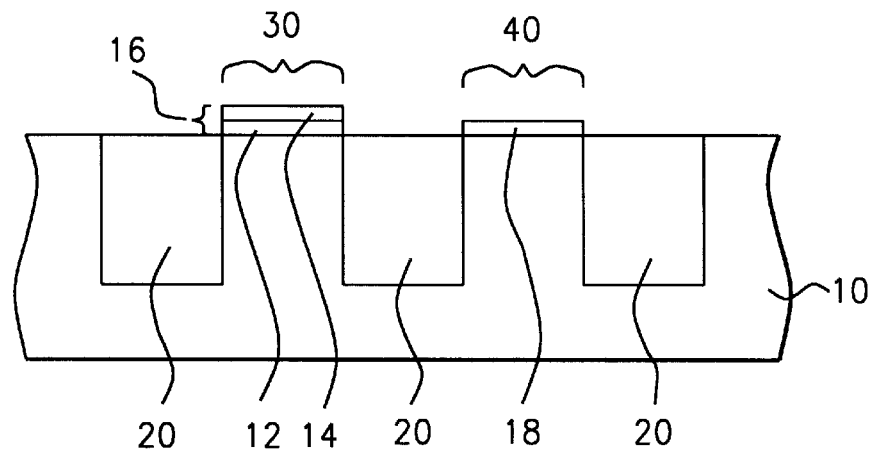

As shown in FIG. 3, thermal oxidation, at a temperature from about 25 to 800° C. for from about 1 second to 600 minutes, is used to simultaneously grow gate oxide layer 18 in second active area 40 and to increase UV oxidation gate oxide layer 12 by adding thermal gate oxide layer 14 to form integral gate oxide layer 16 in first active area 30. Gate oxide layer 16 has a thickness from about 10 to 200 Å and gate oxide layer 18 has a thickness from about 3 to 100 Å. Gate oxide layer 18 is thinner than gate oxide layer 16. CMOS devices may then be formed in first and second active regions 30, 40 utilizing gate oxide layer 16 and thinner gate oxide layer 18, respectively, as follows.

Figure 4:
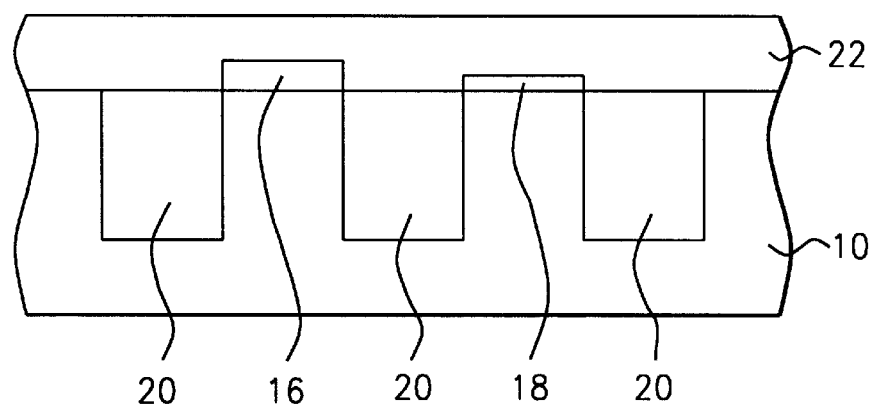

As shown in FIG. 4, a layer of polysilicon 22 may be deposited over the structure including over gate oxide layers 16, 18.

Figure 5:
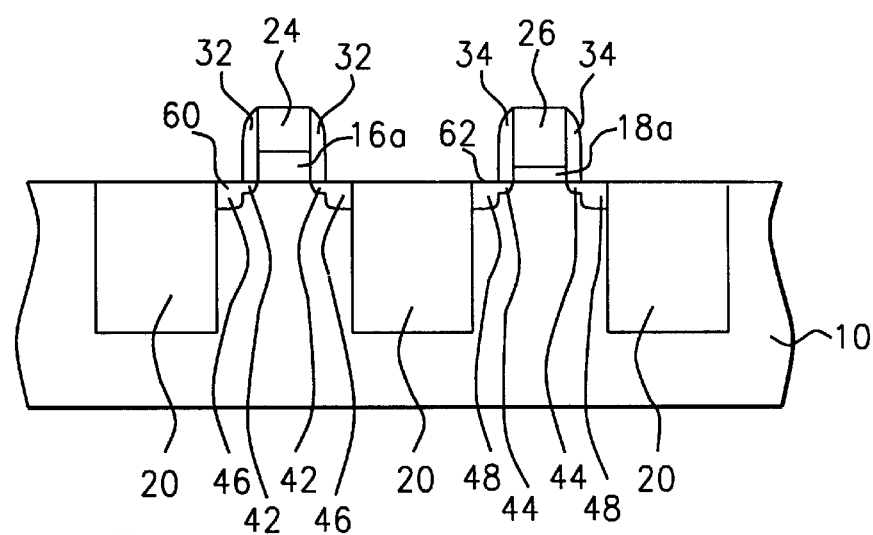

As shown in FIG. 5, polysilicon layer 22 and gate oxide layers 16, 18 may then be patterned to form gate conductor 24 over gate oxide 16*a* and gate conductor 26 over thinner gate oxide 18*a* with gate conductors 24, 26 each having exposed side walls. Gate conductors 24, 26 may be doped in situ during the deposition of polysilicon layer 22.

Low doped source/drain (LDD) ion implants 42, 44 for the respective source/drain junctions may be performed prior to gate spacer 32, 34, respectively, formation.

Gate spacers 32, 34 may be formed adjacent respective gate conductors 24, 26 on their exposed gate side walls by any conventional method. Gate spacers 32, 34 may be comprised of SiN ($Si_3N_4$), for example.

Source and drain 60, 62 may be doped by conventional techniques such as ion implantation and then annealed to form doped source/drain 60, 62 with respective low doped portions 42, 44 and heavily doped regions 46, 48 to complete formation of CMOS devices having gate oxides 16*a*, 18*a* of differing thicknesses.

Of course, multiple thick and thin gate oxide layers may be formed in accordance with the present invention. Just one thick and one thin gate oxide layer were shown as an example, and the order in which the thick and thin oxide layers may be varied as desired.

While particular embodiments of the present invention have been illustrated and described, it is not intended to limit the invention, except as defined by the following claims.

We claim:

1. A method of forming thick and thin gate oxides for CMOS devices, the steps comprising:

providing a silicon semiconductor substrate having first and second active areas, said first and second active areas being separated by shallow trench isolation regions;

forming selective oxide growth over said first active area by UV oxidation to form a first gate oxide layer having a first thickness, wherein said UV oxidation is performed through a mask positioned between an ultraviolet source and said silicon semiconductor substrate, and wherein said mask having an opening that exposes said first active area; and simultaneously oxidizing said first and second active areas; said first thickness of said first gate oxide layer increasing to a second thickness, and a second gate oxide layer having a predetermined thickness is formed in said second active area;

whereby said second thickness of said first gate oxide layer is greater than said thickness of said second gate oxide layer.

2. The method of claim 1, wherein said first thickness of said first gate oxide layer is from about 5 to 100 Å; said second thickness of said first gate oxide layer is from about 10 to 200 Å; and said thickness of said second gate oxide layer is from about 3 to 100 Å.

3. The method of claim 1, including the steps of:

depositing a polysilicon layer over said silicon semiconductor substrate; and patterning said polysilicon layer and said first and second gate oxide layers to form a first gate conductor having a first gate oxide thereunder formed from said first gate oxide layer, and a second gate conductor having a second gate oxide thereunder formed from said second gate oxide layer.

4. The method of claim 1, including the steps of:

depositing a polysilicon layer over said silicon semiconductor substrate;

patterning said polysilicon layer and said first and second gate oxide layers to form a first gate conductor having a first gate oxide thereunder formed from said first gate oxide layer, and a second gate conductor having a second gate oxide thereunder formed from said second gate oxide layer; said first and second gate conductors each having exposed side walls;

forming sidewall spacers on each of said first and second gate conductor exposed side walls; and forming source/drain implants proximate each first and second gate conductor, whereby CMOS devices are formed.

5. The method of claim 1, wherein said UV oxidation is performed at a temperature from about 25 to 800° C. for about 1 second to 600 minutes.

6. The method of claim 1, wherein said UV oxidation is performed using an ultraviolet source emitting a wavelength greater than 250 nm and a wavelength less than or equal to 250 nm through a mask positioned between said ultraviolet source and said silicon substrate, at a temperature from about 25 to 800° C. for about 1 second to 600 minutes; wherein said mask permits UV light from said ultraviolet source to impinge only upon said first active area.

7. The method of claim 1, wherein said UV oxidation is performed using an ultraviolet source emitting a wavelength greater than 250 nm and a wavelength less than or equal to 250 nm through a mask positioned between said ultraviolet source and said silicon substrate, at a temperature from about 25 to 800° C., with an $O_2$ flow rate from about 1000 to 10,000 sccm and/or an $O_3$ flow rate from about 1000 to 10,000 sccm, for about 1 second to 600 minutes; wherein said mask permits UV light from said ultraviolet source to impinge only upon said first active area.

8. The method of claim 1, wherein said simultaneous oxidation is thermal oxidation at a temperature from about 25 to 800° C. for about 1 second to 600 minutes.

9. A method of forming thick and thin gate oxides for CMOS devices, the steps comprising:

providing a silicon semiconductor substrate having first and second active areas, said first and second active areas being separated by shallow trench isolation regions;

forming selective oxide growth over said first active area by UV oxidation performed at a temperature from about 25 to 800° C. for about 1 second to 600 minutes to form a first gate oxide layer having a first thickness, wherein said UV oxidation is performed through a mask positioned between an ultraviolet source and said silicon semiconductor substrate, and wherein said mask having an opening that exposes said first active area; and simultaneously oxidizing said first and second active areas; said first thickness of said first gate oxide layer increasing to a second thickness, and a second gate oxide layer having a predetermined thickness is formed in said second active area;

whereby said second thickness of said first gate oxide layer is greater than said thickness of said second gate oxide layer.

10. The method of claim 9, wherein said first thickness of said first gate oxide layer is from about 5 to 100 Å; said second thickness of said first gate oxide layer is from about 10 to 200 Å; and said thickness of said second gate oxide layer is from about 3 to 100 Å.

11. The method of claim 9, including the steps of:

depositing a polysilicon layer over said silicon semiconductor substrate; and patterning said polysilicon layer and said first and second gate oxide layers to form a first gate conductor having a first gate oxide thereunder formed from said first gate oxide layer, and a second gate conductor having a second gate oxide thereunder formed from said second gate oxide layer.

12. The method of claim 9, including the steps of:

depositing a polysilicon layer over said silicon semiconductor substrate;

patterning said polysilicon layer and said first and second gate oxide layers to form a first gate conductor having a first gate oxide thereunder formed from said first gate oxide layer, and a second gate conductor having a second gate oxide thereunder formed from said second gate oxide layer; said first and second gate conductors each having exposed side walls;

forming sidewall spacers on each of said first and second gate conductor exposed side walls; and forming source/drain implants proximate each first and second gate conductor, whereby CMOS devices are formed.

13. The method of claim 9, wherein said UV oxidation is performed using an ultraviolet source emitting a wavelength greater than 250 nm and a wavelength less than or equal to 250 nm.

14. The method of claim 9, wherein said UV oxidation is performed using an ultraviolet source emitting a wavelength greater than 250 nm and a wavelength less than or equal to 250 nm, with an $O_2$ flow rate from about 1000 to 10,000 sccm and/or an $O_3$ flow rate from about 1000 to 10,000 sccm.

15. The method of claim 9, wherein said simultaneous oxidation is thermal oxidation at a temperature from about 25 to 800° C. for about 1 second to 600 minutes.

16. A method of forming thick and thin gate oxides for CMOS devices, the steps comprising:

providing a silicon semiconductor substrate having first and second active areas, said first and second active areas being separated by shallow trench isolation regions;

forming selective oxide growth over said first active area by UV oxidation, using an ultraviolet source emitting a wavelength greater than 250 nm and a wavelength less than or equal to 250 nm, to form a first gate oxide layer having a first thickness, wherein said UV oxidation is performed through a mask positioned between an ultraviolet source and said silicon semiconductor substrate, and wherein said mask having an opening that exposes said first active area; and simultaneously oxidizing said first and second active areas; said first thickness of said first gate oxide layer increasing to a second thickness, and a second gate oxide layer having a predetermined thickness is formed in said second active area; whereby said second thickness of said first gate oxide layer is greater than said thickness of said second gate oxide layer.

17. The method of claim 16, wherein said first thickness of said first gate oxide layer is from about 5 to 100 Å; said second thickness of said first gate oxide layer is from about 10 to 200 Å; and said thickness of said second gate oxide layer is from about 3 to 100 Å.

18. The method of claim 16, including the steps of:

depositing a polysilicon layer over said silicon semiconductor; and patterning said polysilicon layer and said first and second gate oxide layers to form a first gate conductor having a first gate oxide thereunder formed from said first gate oxide layer, and a second gate conductor having a second gate oxide thereunder formed from said second gate oxide layer.

19. The method of claim 16, including the steps of:

depositing a polysilicon layer over said polysilicon layer;

patterning said polysilicon layer and said first and second gate oxide layers to form a first gate conductor having a first gate oxide thereunder formed from said first gate oxide layer, and a second gate conductor having a second gate oxide thereunder formed from said second gate oxide layer; said first and second gate conductors each having exposed side walls;

forming sidewall spacers on each of said first and second gate conductor exposed side walls; and forming source/drain implants proximate each first and second gate conductor, whereby CMOS devices are formed.

20. The method of claim 16, wherein said simultaneous oxidation is thermal oxidation at a temperature from about 25 to 800° C. for about 1 second to 600 minutes.

21. The method of claim 16, wherein said UV oxidation is performed at a temperature from about 25 to 800° C. for about 1 second to 600 minutes.

22. The method of claim 16, wherein said UV oxidation is performed at a temperature from about 25 to 800° C. for about 1 second to 600 minutes with an $O_2$ flow rate from about 1000 to 10,000 sccm and/or an $O_3$ flow rate from about 1000 to 10,000 sccm.

* * * * *

UNITED STATES PATENT AND TRADEMARK OFFICE
CERTIFICATE OF CORRECTION

PATENT NO. : 6,248,618 B1
DATED : June 19, 2001
INVENTOR(S) : Shyue Fong Quek, Ting Cheong Ang, Puay Ing Ong and Sang Yee Loong It is certified that error appears in the above-identified patent and that said Letters Patent is hereby corrected as shown below:

<u>Title page,</u>
Item [75], delete "Jouor" and replace it with -- Johor --.

Signed and Sealed this

Sixteenth Day of April, 2002

*Attest:*

JAMES E. ROGAN
*Attesting Officer*     *Director of the United States Patent and Trademark Office*